(12) United States Patent
Kim

(10) Patent No.: US 11,100,981 B2
(45) Date of Patent: *Aug. 24, 2021

(54) MEMORY SYSTEM AND OPERATING METHOD OF MEMORY SYSTEM

(71) Applicant: SK hynix Inc., Gyeonggi-do (KR)

(72) Inventor: Dong-Wook Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/104,088

(22) Filed: Nov. 25, 2020

(65) Prior Publication Data

US 2021/0082498 A1 Mar. 18, 2021

Related U.S. Application Data

(63) Continuation of application No. 16/159,952, filed on Oct. 15, 2018, now Pat. No. 10,861,535.

(30) Foreign Application Priority Data

Apr. 20, 2018 (KR) .......................... 10-2018-0046031

(51) Int. Cl.
| | | |
|---|---|---|
| *G11C 11/56* | (2006.01) | |
| *G11C 16/10* | (2006.01) | |
| *G11C 16/08* | (2006.01) | |
| *G11C 8/14* | (2006.01) | |
| *G11C 8/12* | (2006.01) | |
| *G06F 11/14* | (2006.01) | |
| *G11C 16/04* | (2006.01) | |

(52) U.S. Cl.
CPC ...... *G11C 11/5628* (2013.01); *G06F 11/1441* (2013.01); *G11C 8/12* (2013.01); *G11C 8/14* (2013.01); *G11C 16/0483* (2013.01); *G11C 16/08* (2013.01); *G11C 16/10* (2013.01); *G11C 2211/5641* (2013.01)

(58) Field of Classification Search
CPC .......................... G11C 11/56; G11C 11/5628
USPC ............................................................ 365/3
See application file for complete search history.

(56) References Cited

U.S. PATENT DOCUMENTS

| | | | | |
|---|---|---|---|---|
| 9,870,836 B2* | 1/2018 | Ooneda | ................. | G11C 29/52 |
| 10,861,535 B2* | 12/2020 | Kim | ...................... | G11C 16/10 |
| 2016/0180936 A1* | 6/2016 | Choi | ..................... | G11C 29/70 |
| | | | | 365/185.12 |

* cited by examiner

*Primary Examiner* — Muna A Techane
(74) *Attorney, Agent, or Firm* — IP & T Group LLP

(57) ABSTRACT

A memory system includes: a memory device including a three dimensional (3D) cell array, in which memory cells having the same height are coupled to a component word line by units of rows and component word lines having the same height are coupled to a group word line; and a controller suitable for controlling the memory device to perform a program operation with a program data into memory cells coupled to a data component word line selected from a plurality of component word line included in a single group word line and to perform a dummy program operation with dummy data into memory cells coupled to remaining dummy component word lines among the plurality of component word lines.

20 Claims, 11 Drawing Sheets

MEMORY SYSTEM AND OPERATING METHOD OF MEMORY SYSTEM

CROSS-REFERENCE TO RELATED APPLICATION(S)

This application is a continuation of U.S. patent application Ser. No. 16/159,952 filed on Oct. 15, 2018, which claims benefits of priority of Korean Patent Application No. 10-2018-0046031 filed on Apr. 20, 2018. The disclosure of each of the foregoing application is incorporated herein by reference in its entirety.

BACKGROUND

1. Field

Various exemplary embodiments of the present invention generally relate to a memory system. Particularly, the embodiments relate to a method of controlling a memory device to perform a program operation to memory cells with plural pieces of data.

2. Description of the Related Art

The computer environment paradigm has shifted to ubiquitous computing, which allows computer systems to be used anywhere and at any time. As a result, use of portable electronic devices, such as mobile phones, digital cameras, and notebook computers has rapidly increased. These portable electronic devices generally use a memory system for storing data, that is, a data storage device. The memory system may include one or more semiconductor memory devices also referred to simply as memory devices. The memory system may be used as a main or an auxiliary memory device of a portable electronic device.

Such memory systems using memory devices provide excellent stability, durability, high information access speed, and low power consumption, since they have no moving parts (e.g., a mechanical arm with a read/write head) as compared with a hard disk device. Examples of memory systems having such advantages include universal serial bus (USB) memory devices, memory cards having various interfaces, and solid state drives (SSD).

SUMMARY

Various embodiments of the invention are directed to a memory system capable of programming program data and dummy data into memory cells coupled to component word lines included in a group word line, and an operating method thereof.

In accordance with an embodiment of the invention, a memory system may include: a memory device including a three dimensional (3D) cell array, in which memory cells having the same height are coupled to a component word line by units of rows and component word lines having the same height are coupled to a group word line; and a controller suitable for controlling the memory device to perform a program operation with a program data into memory cells coupled to a data component word line selected from a plurality of component word line included in a single group word line and to perform a dummy program operation with dummy data into memory cells coupled to remaining dummy component word lines among the plurality of component word lines.

In accordance with an embodiment of the invention, an operating method of a memory system may include: programming a program data into memory cells coupled to a data component word line selected from among a plurality of component word line included in a single group word line of a three (3) dimensional (3D) cell array; and programming a dummy data into memory cells coupled to remaining dummy component word lines among the plurality of component word lines included in the single group word line.

In accordance with an embodiment of the invention, concurrent failure may be prevented by programming program data and dummy data into memory cells coupled to component word lines included in a group word line.

In accordance with an embodiment of the invention, a memory system may include: a three-dimensional (3D) cell array which is split into plural first groups, each coupled to each group word line, wherein each of the plural first group includes plural second groups, each including plural memory cells coupled with a single component word line; and a controller suitable for recognizing program data in predetermined-size piece units, distributing each piece of the program data to each of the first groups, and programing the piece of the program into some second group of the first group and dummy data into the other second group of the first group.

DETAILED DESCRIPTION

Figure 1:
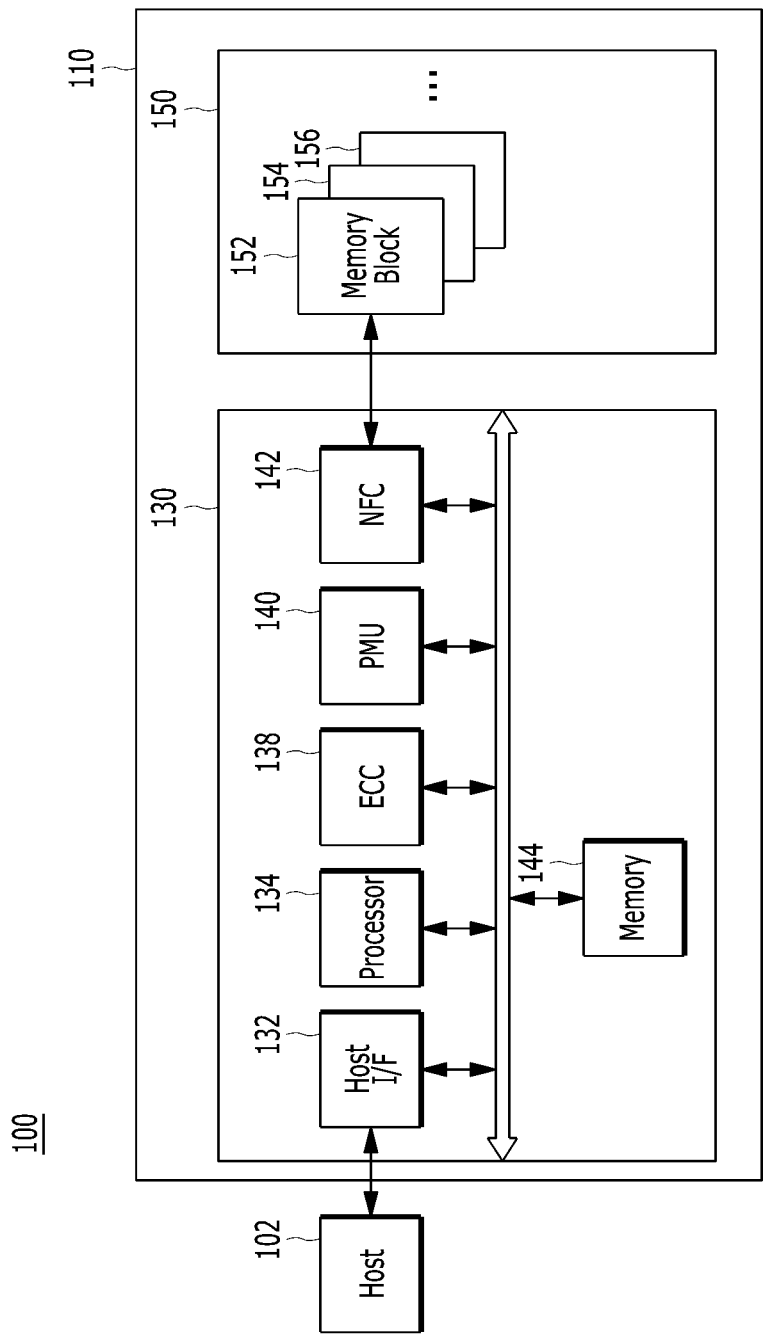
FIG. 1 is a diagram illustrating a data processing system including a memory system, according to an embodiment according to an embodiment of the invention.

Various embodiments will be described below in more detail with reference to the accompanying drawings. The invention may, however, be embodied in different forms and should not be construed as being limited to the embodiments set forth herein. Rather, these embodiments are provided so that this disclosure will be thorough and complete, and will fully convey the invention to those skilled in the relevant art. Throughout the disclosure, like reference numerals refer to like parts throughout the various figures and embodiments of the invention. It is noted that reference to "an embodiment" does not necessarily mean only one embodiment, and different references to "an embodiment" are not necessarily to the same embodiment(s).

It is also noted that in this specification, "connected/coupled" refers to one component not only directly coupling another component, but also indirectly coupling another component through an intermediate component. In addition, a singular form may include a plural form and vice versa as, long as it is not specifically stated otherwise. It should be readily understood that the meaning of "on" and "over" in the disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it may not only refer to a case where the first layer is formed directly on the second layer or the substrate but may also refer to a case where a third layer exists between the first layer and the second layer or the substrate.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the disclosure will be described in more detail with reference to the drawings.

FIG. 1 is a block diagram illustrating a data processing system 100 including a memory system, according to an embodiment of the disclosure.

Referring to FIG. 1, the data processing system 100 may include a host 102 and a memory system 110.

The host 102 may be or include, for example, a portable electronic device, such as a mobile phone, an MP3 player and a laptop computer. The host 102 may also be or include, for example, an electronic device, such as a desktop computer, a game player, a TV and a projector.

The memory system 110 may operate in response to a request from the host 102. For example, the memory system 110 may store data to be accessed by the host 102. The memory system 110 may work as a main memory system of the host 102. The memory system may be used as an auxiliary memory system of the host 102. The memory system 110 may include any one of various kinds of storage devices, according to the protocol of a host interface to be coupled electrically with the host 102. The memory system 110 may be or include any one of various kinds of storage devices, such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be or include a volatile memory device, such as a dynamic random access memory (DRAM), a static random access memory (SRAM) and the like. The storage devices for the memory system 110 may be or include a nonvolatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magneto-resistive RAM (MRAM), a resistive RAM (RRAM) and the like.

The memory system 110 may include a memory device 150 and a controller 130. The memory device may store data to be accessed by the host 102. The controller 130 may control the storage of data in the memory device 150.

The controller 130 and the memory device 150 may be integrated into a single semiconductor device. For instance, the controller 130 and the memory device 150 may be integrated into a single semiconductor device configured as a solid state drive (SSD). When the memory system 110 is configured as a SSD, the operation speed of the host 102 that is coupled electrically with the memory system 110 may be significantly increased.

The controller 130 and the memory device 150 may be integrated into a single semiconductor device configured as a memory card. The controller 130 and the memory card 150 may be integrated into a single semiconductor device configured as a memory card, such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, a universal flash storage (UFS) device and the like.

In an embodiment, the memory system 110 may include a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system and the like.

The memory device 150 may store data provided from the host 102 during a write operation. The memory device 150 may provide stored data to the host 102 during a read operation. The memory device 150 may include a plurality of memory blocks 152, 154, 156, . . . (hereinafter, referred to as "memory blocks 152 to 156"). Each of the memory blocks 152 to 156 may include a plurality of pages. Each of the pages may include a plurality of memory cells to which one or more word lines (WL) may be coupled electrically.

The memory device 150 may retain stored data when power supplied to the device is interrupted or turned off. The memory device 150 may be a nonvolatile memory device, for example, a flash memory. The flash memory may have a three-dimensional (3D) stack structure. A 3D stack structure of a memory device 150 is described later in more detail with reference to FIGS. 2 to 11.

The controller 130 may control the memory device 150 in response to a request received from the host 102. The controller 130 may control the flow of data between the memory device 150 and the host 102. For example, the controller 130 may provide data read from the memory device 150 to the host 102, and store data provided from the host 102 into the memory device 150. To this end, the controller 130 may control the overall operations of the memory device 150, such as, for example, read, write, program and erase operations.

In the example of FIG. 1, the controller 130 may include a host interface 132, a processor 134, an error correction code (ECC) component 138, a power management unit 140, a memory interface 142 (e.g., a NAND flash controller), and a memory 144.

The host interface 132 may process commands and data provided from the host 102. The host interface 132 may communicate with the host 102 under at least one of various interface protocols, such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), integrated drive electronics (IDE) and the like.

The ECC component 138 may detect and correct errors in the data read from the memory device 150 during a read operation. For example, the ECC component 138 may not correct error bits when the number of the error bits is greater than or equal to a threshold number of correctable error bits. The ECC component 138 may output an error correction fail signal indicating failure in correcting the error bits.

The ECC component 138 may perform an error correction operation based on a coded modulation, such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC component 138 may include other circuits, systems or devices which may be needed for the error correction operation.

The PMU 140 may provide and or manage an electrical power for the controller 130, that is, power for the component elements included in the controller 130. Any suitable power module may be used.

The memory interface 142 may serve as a memory interface between the controller 130 and the memory device 150 for allowing the controller 130 to control the memory device 150, for example, in response to a request received from the host 102. The memory interface 142 may generate control signals for carrying out operation onto the memory device 150 and transfer or receive data under the control of the processor 134. The memory device 150 is a flash memory, for example, when the memory device 150 is a NAND flash memory. The memory interface 142 may include any suitable interface unit suitable for interfacing the memory device 150 to the controller. For example, the memory interface 142 may be an NFC unit providing an interface for engaging the NAND flash memory with the controller. It is noted that the specific architecture and functionality of the memory interface 142 may vary depending upon the type of the memory device employed.

The memory 144 may serve as a memory supporting operations performed in the memory system 110, particularly, the controller 130. The memory 144 may load or store data (e.g., instructions, codes, engines or programs) for operations in or by the memory system 110 and the controller 130. The controller 130 may control the memory device 150 in response to a request received from the host 102. For example, the controller 130 may provide the data read from the memory device 150 to the host 102 while storing the data provided from the host 102 in the memory device 150. When the controller 130 controls the operations of the memory device 150, the memory 144 may store data treated by the controller 130 and the memory device 150 for such operations as read, write, program and erase operations.

The memory 144 may include any suitable memory device. The memory 144 may be a volatile memory. For example, the memory 144 may include a static random access memory (SRAM). In another example, the memory 144 may include a dynamic random access memory (DRAM). The memory 144 may include any suitable architecture. For example, the memory 144 may include a program memory, a data memory, a write buffer, a read buffer, a map buffer and the like all of which are well known in the art.

The processor 134 may control general operations of the memory system 110. The processor 134 may control a write operation or a read operation for the memory device 150, in response to a write request or a read request received from the host 102. The processor 134 may include at least one any suitable processor. The processor 134 may use a firmware, which is referred to as a flash translation layer (FTL), to control the general operations of the memory system 110. The processor 134 may include at least one microprocessor. Any suitable microprocessor may be applicable. The processor 134 may include a central processing unit (CPU).

A bad block management unit (not shown) may be included in the processor 134, for performing bad block management of the memory device 150. The bad block management unit may find out bad memory blocks included in the memory device 150, which are in unsatisfactory condition for further use, to perform bad block management on the bad memory blocks. When the memory device 150 is a flash memory, for example, a NAND flash memory, a program failure may occur during the write operation, for example, during the program operation, due to characteristics of a NAND memory cell or a NAND supplemental logic. During the bad block management operation, the data of the program-failed memory block or the bad memory block may be programmed into a new memory block. Bad blocks due to a program fail may seriously deteriorate the utilization efficiency of the memory device 150 and the reliability of the memory system 100. Thus, reliable bad block management may be included in the processor 134 for resolving these concerns.

Figure 2:
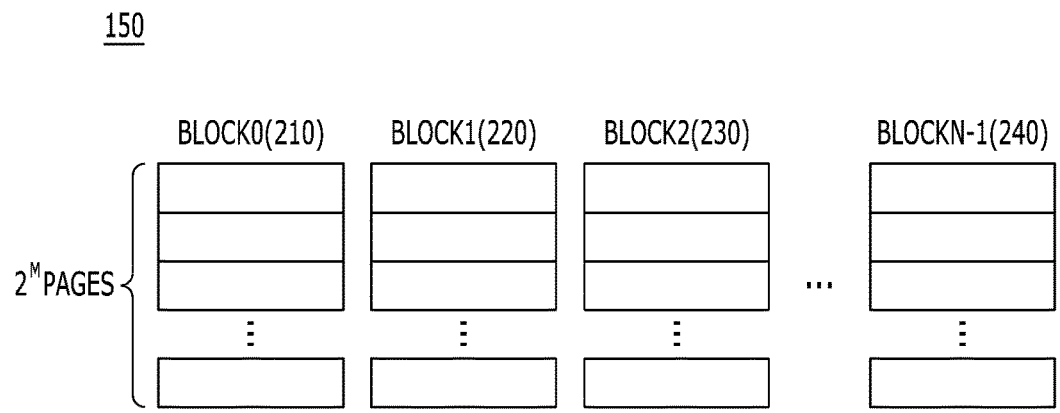
FIG. 2 is a diagram illustrating a memory device of the memory system shown in FIG. 1, according to an embodiment of the invention.

FIG. 2 is a diagram illustrating an example of a memory device according to an embodiment, for example the memory device 150 shown in FIG. 1.

Referring to FIG. 2, the memory device 150 may include a plurality of memory blocks, for example, memory blocks BLOCK0(210) to BLOCKN-1(240). Each of the plurality of memory blocks BLOCK0(210) to BLOCKN-1(240) may include a plurality of pages, for example, $2^M$ number of pages ($2^M$ PAGES), to which the invention will not be limited. Each of the plurality of pages may include a plurality of memory cells to which a plurality of word lines may be coupled electrically.

The memory blocks may be single level cell (SLC) memory blocks or multi-level cell (MLC) memory blocks, according to the number of bits which may be stored or expressed in each memory cell. An SLC memory block may include a plurality of pages including a plurality of memory cells, each memory cell being capable of storing 1-bit data. An MLC memory block may include a plurality of pages including a plurality of memory cells, each memory cell being capable of storing multi-bit data, for example, two or more-bit data. An MLC memory block including a plurality of pages which are implemented with memory cells that are individually capable of storing 3-bit data may be referred to as a triple level cell (TLC) memory block.

Each of the plurality of memory blocks BLOCK0(210) to BLOCKN-1(240) may store the data provided from the host device 102 during a write operation. The plurality of memory blocks BLOCK0(210) to BLOCKN-1(240) may provide stored data to the host 102 during a read operation.

Figure 3:
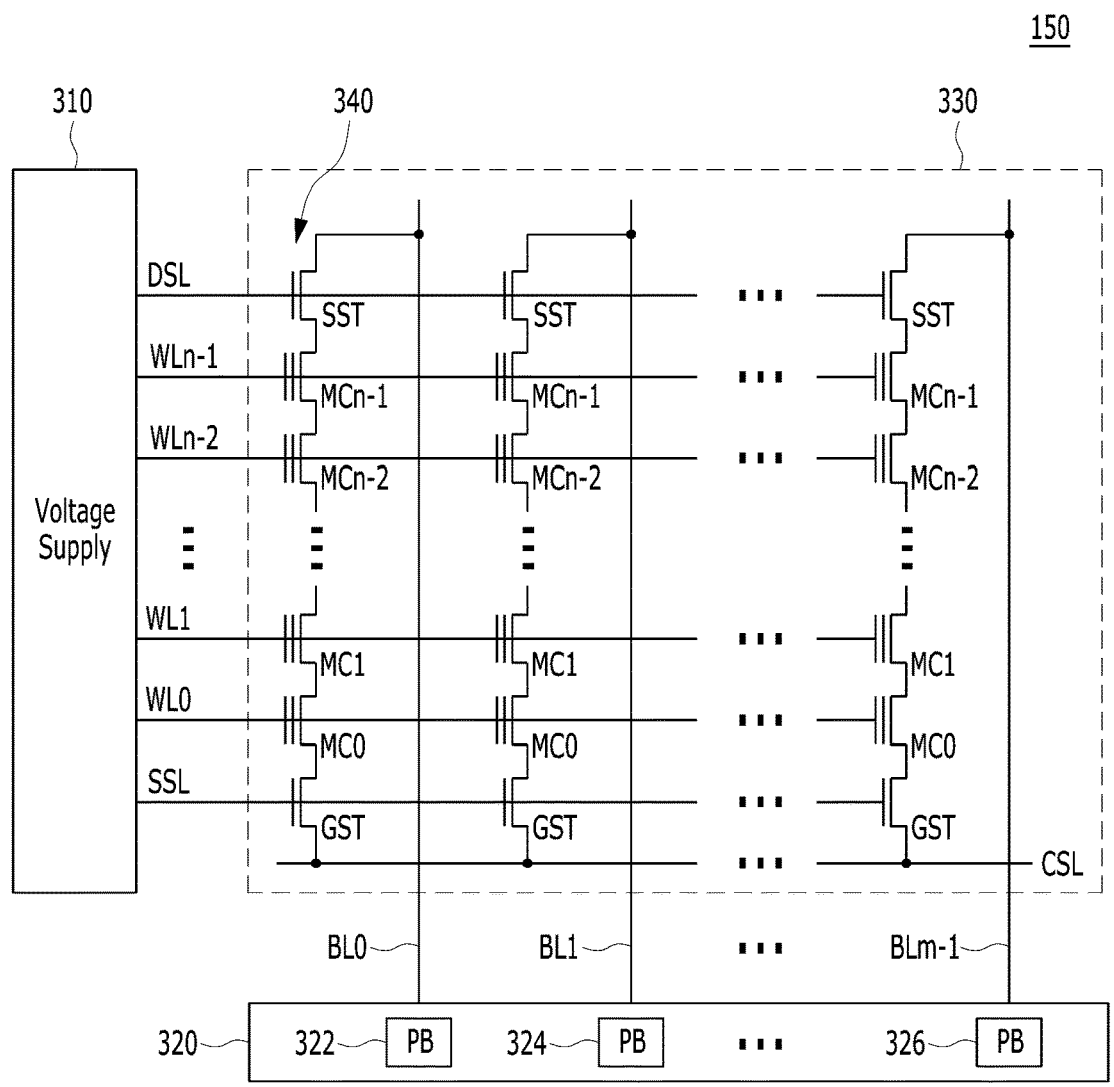
FIG. 3 is a circuit diagram illustrating a memory block of a memory device, according to an embodiment of the invention.

FIG. 3 is a circuit diagram illustrating any one memory block among the plurality of memory blocks according to an embodiment, for example the memory blocks 152 to 156 shown in FIG. 1.

Referring to FIG. 3, the memory block 330 of the memory device 150 may include a plurality of cell strings 340 which are coupled electrically to bit lines BL0 to BLm-1, respectively. For example, the memory block 330 may correspond to any of the plurality of memory blocks 152 to 156 in the memory device 150. The cell string 340 of each column may include at least one drain select transistor DST and at least one source select transistor SST. A plurality of memory cells or a plurality of memory cell transistors MC0 to MCn-1 may be coupled electrically in series between the select transistors DST, SST. The respective memory cells MC0 to MCn-1 may be configured by multi-level cells (MLC), each storing data information of a plurality of bits. The strings 340 may be coupled electrically to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 according to with the embodiment is not limited to a NAND flash memory. The memory block 152 may be realized by a NOR flash memory, a hybrid flash memory in which at least two kinds of memory cells are combined, or a one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply 310 in the memory device 150 may provide word line voltages, for example, a program voltage, a read voltage and a pass voltage, to be selectively supplied to respective word lines according to an operation mode. The voltage supply 310 may provide voltages to be supplied to bulks, for example, well regions in which the memory cells are arranged. The voltage supply 310 may generate plural voltages having different levels in response to a control signals delivered from a control circuit (not shown). For example, the voltage supply 310 may generate a plurality of variable read voltages for generating a plurality of read data and selecting one of the memory blocks or sectors of a memory cell array under the control of the control circuit. The voltage supply 310 may select one of the word lines of the selected memory block, and provide different word line voltages to the selected word line and unselected word lines.

A read and write (read/write) circuit 320 of the memory device 150 may be controlled by the control circuit. The read/write circuit 320 may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation. The read/write circuit 320 may make a current flow on the bit lines according to the inputted data. To this end, the read/write circuit 320 may include a plurality of page buffers 322, 324, 326 respectively corresponding to columns (or bit lines) or pairs of columns (or pairs of bit lines), and a plurality of latches (not shown) may be included in each of the page buffers 322, 324, 326.

FIGS. 4 to 11 are schematic diagrams illustrating the memory device 150 shown in FIG. 1.

Figure 4:
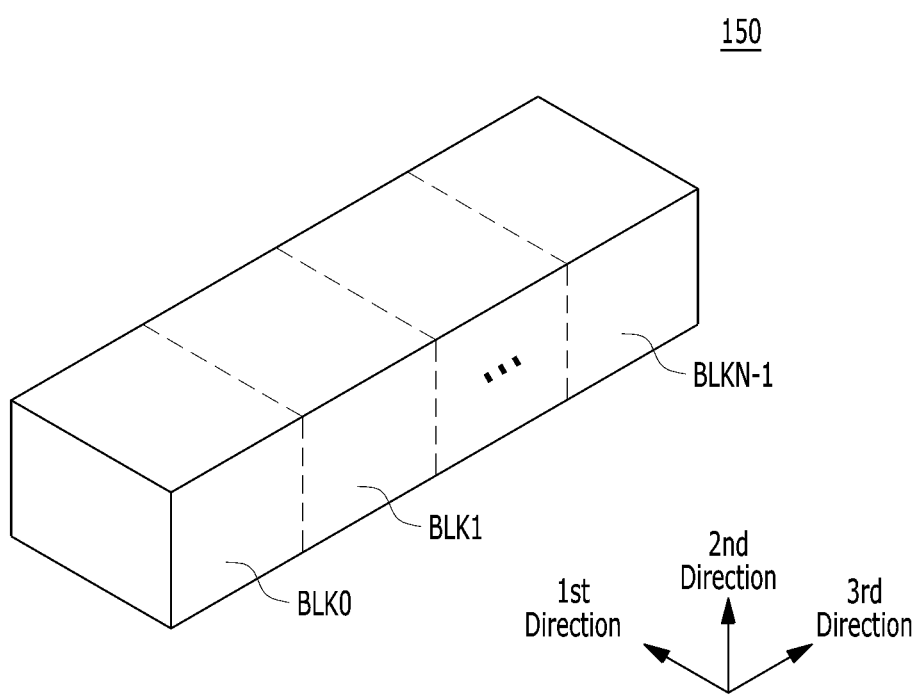
FIGS. 4 to 11 are diagrams schematically illustrating a memory device of the memory system, according to an embodiment of the invention.

FIG. 4 is a block diagram illustrating an example structure of the plurality of memory blocks 152 to 156 of the memory device 150 shown in FIG. 1.

Referring to FIG. 4, the memory device 150 may include a plurality of memory blocks BLK0 to BLKN-1. The memory blocks BLK0 to BLKN-1 in FIG. 4 may correspond to the memory blocks 152 to 156 of FIG. 1. Each of the memory blocks BLK0 to BLKN-1 may be implemented with a three-dimensional (3D) structure or a vertical structure. The respective memory blocks BLK0 to BLKN-1 may include structures extending in first to third directions, for example, an x-axis, a y-axis, and a z-axis direction.

The respective memory blocks BLK0 to BLKN-1 may include a plurality of NAND strings NS extending in the second direction. The plurality of NAND strings NS may be provided in the first direction and the third direction. Each NAND string NS may be coupled electrically to a bit line BL, at least one source select line SSL, at least one ground select line GSL, a plurality of word lines WL, at least one dummy word line DWL and a common source line CSL. Namely, the respective memory blocks BLK0 to BLKN-1 may be coupled electrically to a plurality of bit lines BL, a plurality of source select lines SSL, a plurality of ground select lines GSL, a plurality of word lines WL, a plurality of dummy word lines DWL and a plurality of common source lines CSL.

Figure 5:
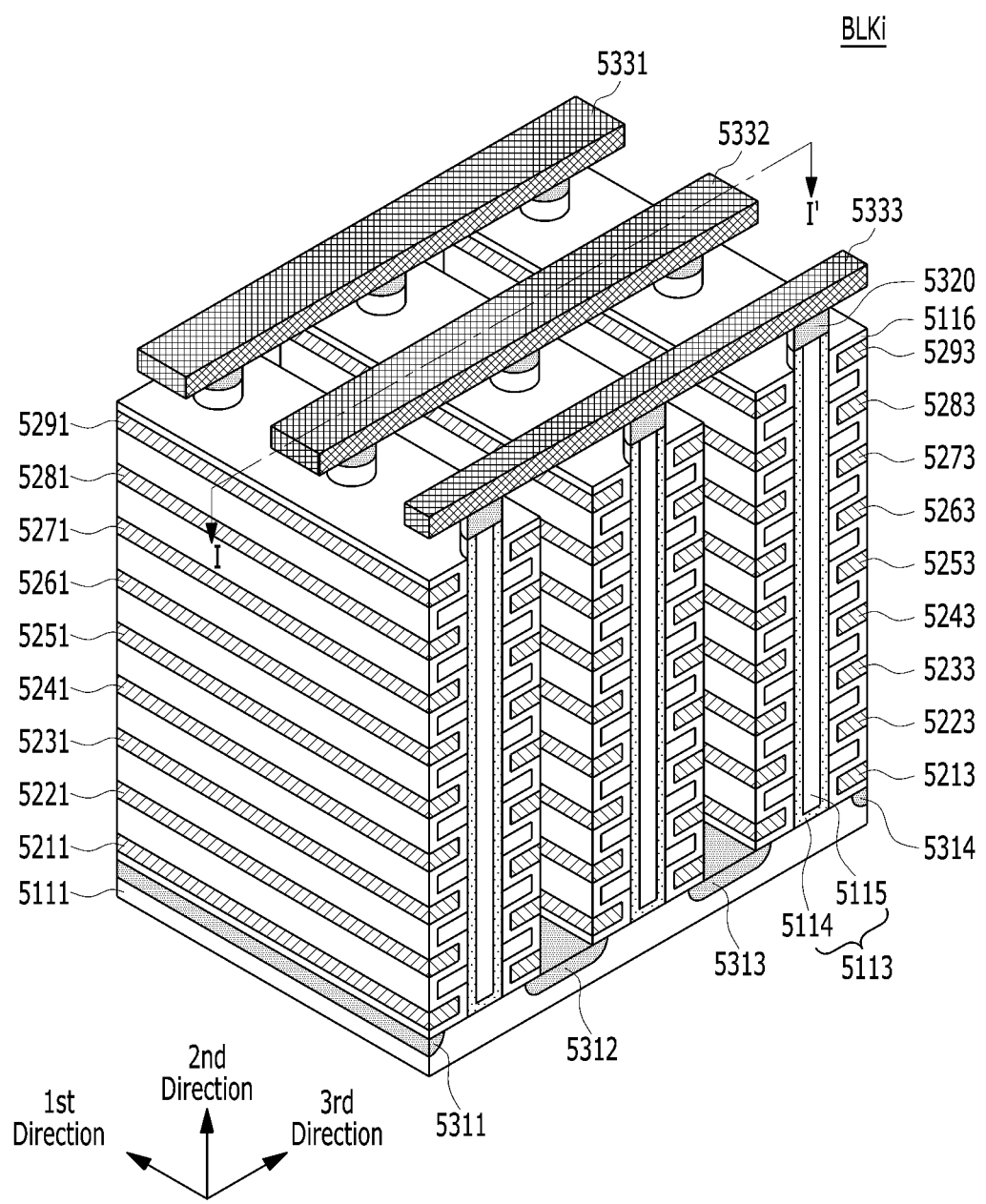
Figure 6:
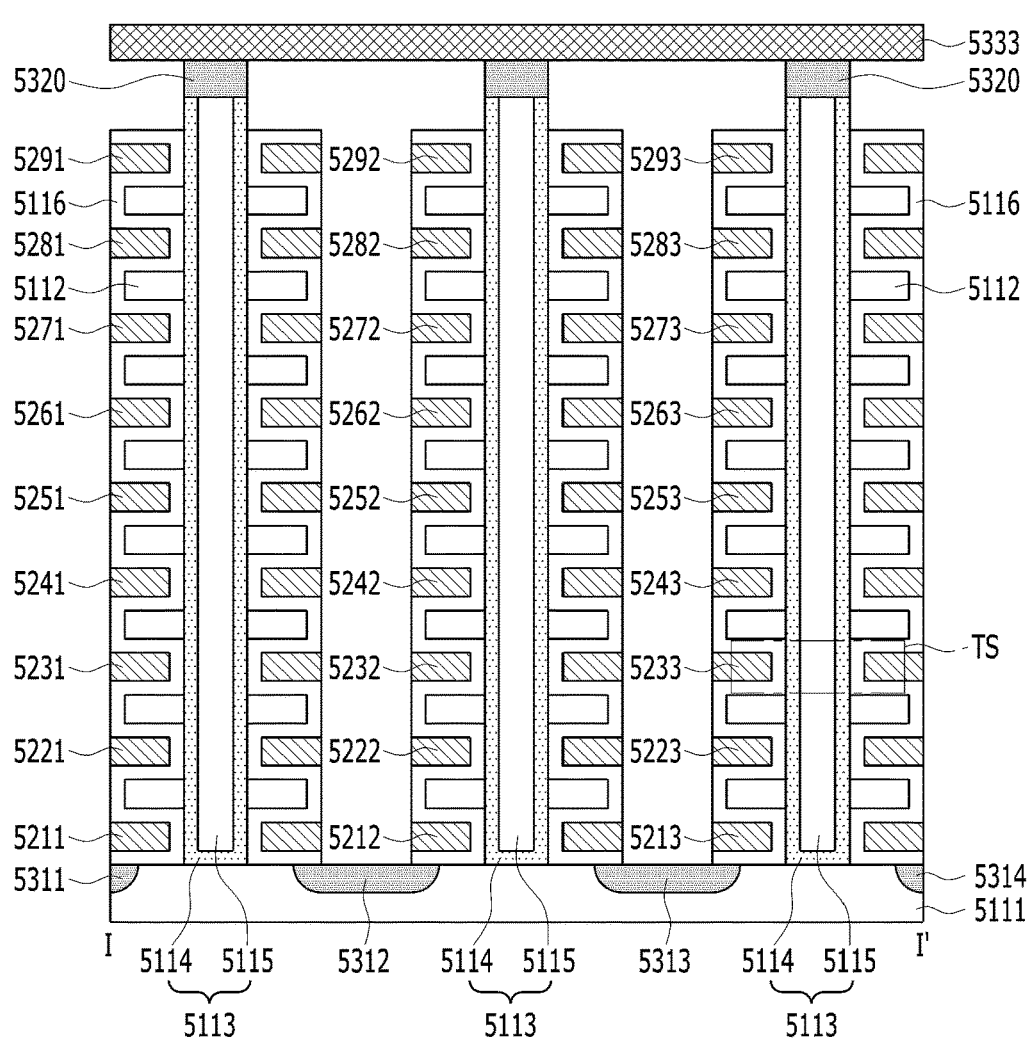

FIG. 5 is a perspective view of one memory block BLKi among the plurality of memory blocks according to an embodiment, for example the plurality of memory blocks BLK0 to BLKN-1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure extending in the first to third directions.

A substrate 5111 may be provided. The substrate 5111 may include a silicon material doped with a first type impurity. For example, the substrate 5111 may include a silicon material doped with a p-type impurity or may be a p-type well such as a pocket p-well, and include an n-type well which surrounds the p-type well. While it is assumed for ease of description that the substrate 5111 is p-type silicon, it is to be noted that the substrate 5111 is not limited to a p-type silicon material.

A plurality of doping regions 5311 to 5314 extending in the first direction may be provided over the substrate 5111. The plurality of doping regions 5311 to 5314 may contain a second type of impurity that is different from the type of impurity of the substrate 5111. For example, the plurality of doping regions 5311 to 5314 may be doped with an n-type impurity. While it is assumed for ease of description that first to fourth doping regions 5311 to 5314 are n-type, it is to be noted that the first to fourth doping regions 5311 to 5314 are not limited to an n-type material.

In the region over the substrate 5111 between the first and second doping regions 5311 and 5312, a plurality of dielectric materials 5112 extending in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be arranged. The plurality of pillars 5113 may individually penetrate through the dielectric materials 5112 to be coupled electrically with the substrate 5111. Each pillar 5113 may be configured by a plurality of conductive materials. By way of example and not limitation, the surface layer 5114 of each pillar 5113 may include a silicon material doped with the first type of impurity. That is, the surface layer 5114 of each pillar 5113 may include a silicon material doped with the same type of impurity as the substrate 5111. While it is assumed for ease of description that the surface layer 5114 of each pillar 5113 may include p-type silicon, the surface layer 5114 of each pillar 5113 is not limited to p-type silicon.

An inner layer 5115 of each pillar 5113 may be formed of a dielectric material. For example, the inner layer 5115 of each pillar 5113 may be filled by a dielectric material such as silicon oxide.

In the region between the first and second doping regions 5311 and 5312, a dielectric layer 5116 may be arranged along the exposed surfaces of the dielectric materials 5112, the pillars 5113 and the substrate 5111. The thickness of the dielectric layer 5116 may be less than half of the distance between the dielectric materials 5112. In other words, a region or a space for a material other than the dielectric material 5112 and the dielectric layer 5116 may be located between two dielectric layers 5116. For example, one region may be arranged over the bottom surface of a first dielectric material of the dielectric materials 5112, and the other region may be arranged over the top surface of a second dielectric material of the dielectric materials 5112. The dielectric materials 5112 may include another dielectric material below the first dielectric material.

In the region between the first and second doping regions 5311 and 5312, conductive materials 5211 to 5291 may be provided over the exposed surface of the dielectric layer 5116. The conductive material 5211 extending in the first direction may be provided between the dielectric material 5112 adjacent to the substrate 5111 and the substrate 5111.

For example, the conductive material 5211 extending in the first direction may be arranged between two dielectric layers 5116: one may be disposed over the substrate 5111 and the other may be disposed over the bottom surface of the dielectric material 5112 adjacent to the substrate 5111.

The conductive material extending in the first direction may be provided between two dielectric layers 5116: one may be disposed over the top surface of one of the dielectric materials 5112, and the other may be disposed over the bottom surface of another dielectric material of the dielectric materials 5112, which is disposed over the certain dielectric material 5112. The conductive materials 5221 to 5281 extending in the first direction may be arranged between the dielectric materials 5112. The conductive material 5291 extending in the first direction may be provided over the uppermost dielectric material 5112. The conductive materials 5211 to 5291 extending in the first direction may include a metallic material. In another example, the conductive materials 5211 to 5291 extending in the first direction may include a conductive material such as polysilicon.

In the region between the second and third doping regions 5312 and 5313, structures same as ones located between the first and second doping regions 5311 and 5312 may be arranged. For example, in the region between the second and third doping regions 5312 and 5313, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 extending in the first direction may be arranged.

In the region between the third and fourth doping regions 5313 and 5314, structures same as ones located between the first and second doping regions 5311 and 5312 may be arranged. For example, in the region between the third and fourth doping regions 5313 and 5314, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 extending in the first direction may be arranged.

Drains 5320 may be respectively provided over the plurality of pillars 5113. The drains 5320 may include silicon materials doped with second type impurities. For example, the drains 5320 may include silicon materials doped with n-type impurities. While it is assumed for ease of description that the drains 5320 include n-type silicon, it is to be noted that the drains 5320 are not limited to just n-type silicon. Further, although FIG. 6 illustrates for ease of description and illustration that the width of each of the drains 5320 is equal to the width of each of the pillars 5113, it is to be noted that the width of each drain 5320 is not limited thereto. That is, the width of each drain 5320 may be larger than that of each corresponding pillar 5113. Each drain 5320 may be provided in the shape of a pad over the top surface of each corresponding pillar 5113.

Conductive materials 5331 to 5333 extending in the third direction may be provided over the drains 5320. The conductive materials 5331 to 5333 may be sequentially disposed in the first direction. The respective conductive materials 5331 to 5333 may be coupled electrically with each of the drains 5320 in corresponding regions. The drains 5320 and the conductive materials 5331 to 5333 extending in the third direction may be coupled electrically with each other through contact plugs, respectively. The conductive materials 5331 to 5333 extending in the third direction may include a metallic material. The conductive materials 5331 to 5333 extending in the third direction may include a conductive material such as polysilicon.

In FIGS. 5 and 6, strings may include the respective pillars 5113 with the dielectric layer 5116 and the conductive materials 5211 to 5291, 5212 to 5292, and 5213 to 5293 extending in the first direction. The respective pillars 5113 may constitute NAND strings NS together with the dielectric layer 5116 and the conductive materials 5211 to 5291, 5212 to 5292, and 5213 to 5293 extending in the first direction. Each NAND string NS may include a plurality of transistor structures TS.

Figure 7:
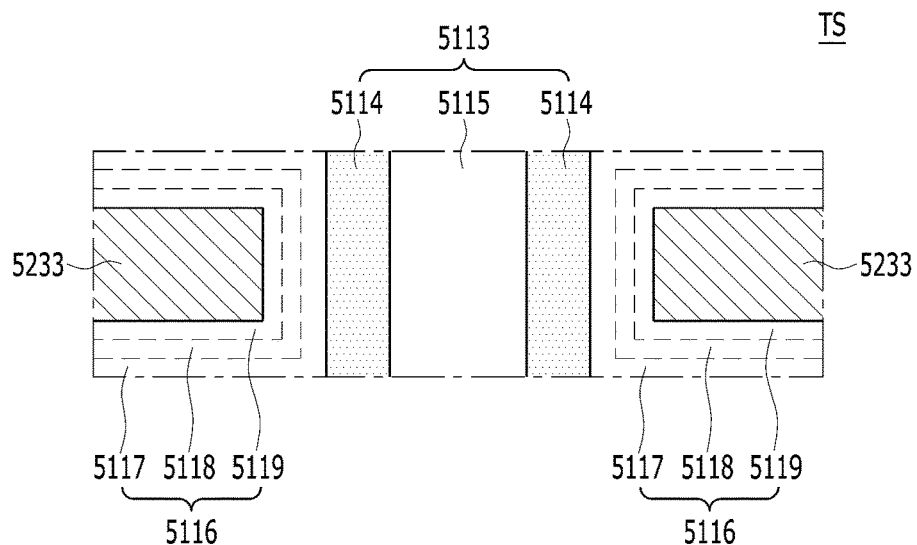

FIG. 7 is a cross-sectional view of the transistor structure TS shown in FIG. 6. The transistor structure TS of FIG. 7 will be described with references to FIGS. 5 and 6.

Referring to FIG. 7, in the transistor structure TS shown in FIG. 6, the dielectric layer 5116 may include first to third sub dielectric layers 5117, 5118, and 5119.

The surface layer 5114 of p-type silicon in each of the pillars 5113 may serve as a body of transistor. The first sub dielectric layer 5117 adjacent to the pillar 5113 may serve as a tunneling dielectric layer. The first sub dielectric layer 5117 may include a thermal oxidation layer.

The second sub dielectric layer 5118 may serve as a charge storing layer. In other words, the second sub dielectric layer 5118 may work as a charge capturing layer. The second sub dielectric layer 5118 may include a nitride layer or a metal oxide layer, such as an aluminum oxide layer, a hafnium oxide layer or the like.

The third sub dielectric layer 5119 adjacent to the conductive material 5233 may serve as a blocking dielectric layer. The third sub dielectric layer 5119 adjacent to the conductive material 5233 extending in the first direction may be constituted with a single layer or multiple layers. The third sub dielectric layer 5119 may include a high-k dielectric layer, such as an aluminum oxide layer, a hafnium oxide layer or the like, which has a dielectric constant greater than the first and second sub dielectric layers 5117 and 5118.

The conductive material 5233 may work as a gate or a control gate. That is, the gate or the control gate 5233, the blocking dielectric layer 5119, the charge storing layer 5118, the tunneling dielectric layer 5117 and the body 5114 may constitute a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

Referring back to FIGS. 5 and 6, the memory block BLKi may include the plurality of pillars 5113. Namely, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least another one of the plurality of transistor structures TS of each NAND string NS may work as a ground select transistor GST.

The gates or control gates may correspond to the conductive materials 5211 to 5291, 5212 to 5292, and 5213 to 5293 extending in the first direction. In other words, the gates or the control gates may extend in the first direction to constitute word lines and at least two select lines, at least one source select line SSL and at least one ground select line GSL.

The conductive materials 5331 to 5333 extending in the third direction may be coupled electrically to one end of the NAND strings NS. The conductive materials 5331 to 5333 extending in the third direction may serve as bit lines BL. That is, in one memory block BLKi, the plurality of NAND strings NS may be coupled electrically to one-bit line BL.

The second type doping regions 5311 to 5314 extending in the first direction may be provided to the other ends of the NAND strings NS. The second type doping regions 5311 to 5314 extending in the first direction may serve as common source lines CSL.

Namely, the memory block BLKi may include a plurality of NAND strings NS extending in a direction perpendicular to the substrate 5111, and may serve as a NAND flash memory block, for example, of a charge capturing type memory, in which a plurality of NAND strings NS are coupled electrically to one-bit line BL.

While it is illustrated in FIGS. 5 to 7 that the conductive materials 5211 to 5291, 5212 to 5292, and 5213 to 5293 extending in the first direction are included in 9 different layers, it is to be noted that the conductive materials 5211 to 5291, 5212 to 5292, and 5213 to 5293 extending in the first direction are not limited to being provided in 9 layers. For example, conductive materials extending in the first direction may be included in 8 layers, 16 layers or any multiple of layers. In other words, in one NAND string NS, the number of transistors may vary depending on design.

Although FIGS. 5 to 7 illustrate a single bit line BL coupled to three (3) NAND strings NS, an embodiment of the invention will not be limited to the single bit line BL coupled to three (3) NAND strings NS. For example, a single bit line BL of a memory block BLKi may be coupled to 'm' numbers of NAND strings NS. Here, the number of conductive materials 5211 to 5291, 5212 to 5292, and 5213 to 5293, which are extended in the first direction, and the number of common source lines 5311, 5312, 5313, and 5314, which are extended in the first direction, may be adjusted as many as the number of NAND strings NS coupled to a single bit line BL.

Although FIGS. 5 to 7 illustrate three (3) NAND strings NS coupled to a single conductive material extended in the first direction, an embodiment of the invention will not be limited to the three (3) NAND strings NS coupled to a single conductive material extended in the first direction. For example, 'n' numbers of NAND strings NS coupled to a single conductive material extended in the first direction. Here, the number of bit lines 5331, 5332, and 5333 may be adjusted as many as a number of NAND strings NS coupled to a single conductive material extended in the first direction.

Figure 8:
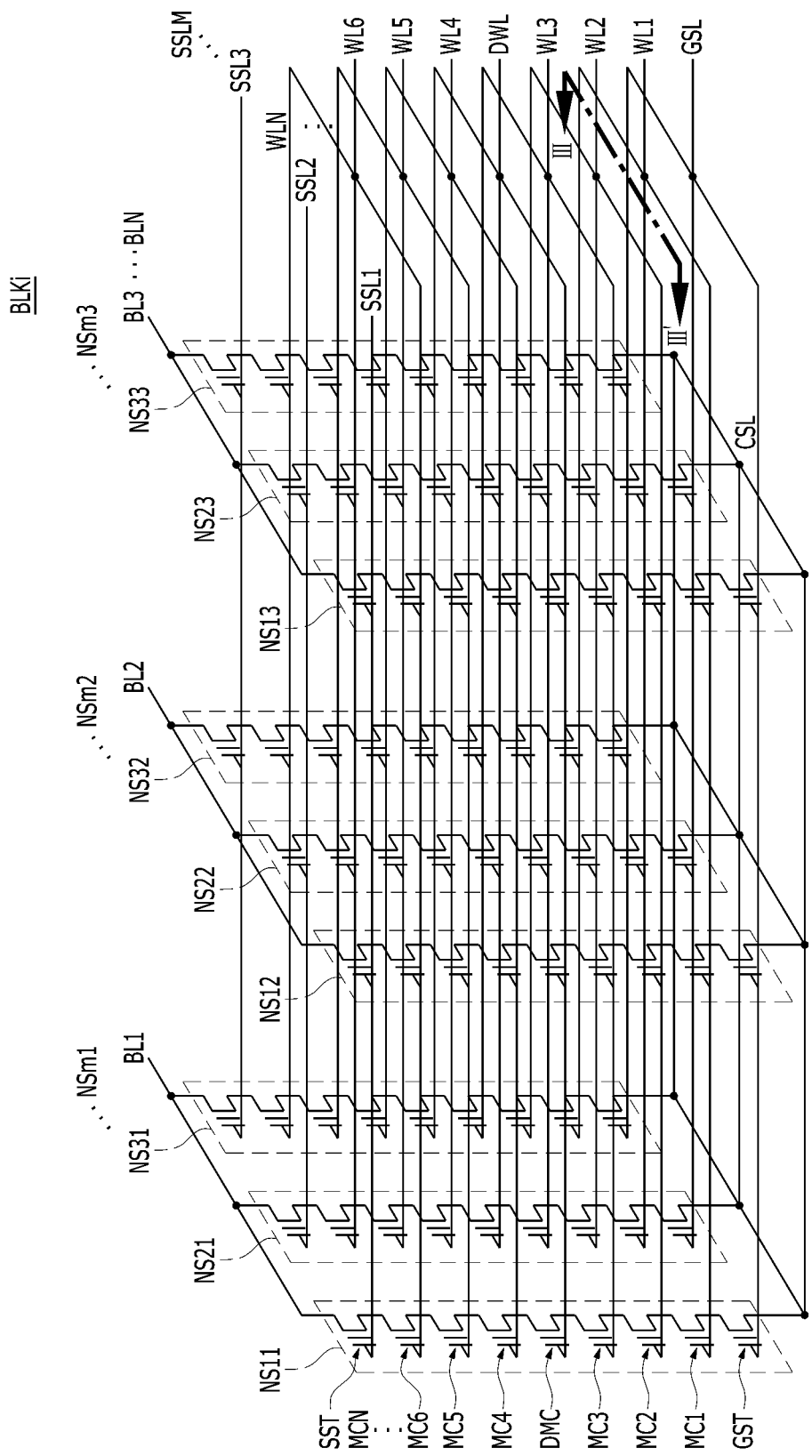

FIG. 8 is a circuit diagram illustrating an example of any one memory block BLKi among the plurality of memory blocks according to an embodiment, for example the memory blocks BLK0 to BLKN-1 of FIG. 4.

Referring to FIG. 8, a memory block BLKi includes plurality of memory cells MC1 to MCN, and plurality of word lines WL1 to WLN. The memory block BLKi includes plurality of NAND strings NS11 to NSm1, NS12 to NSm2, and NSm3. The memory block BLKi includes plurality of source select lines SSL1 to SSLM.

Referring to FIG. 8, in the memory block BLKi having the first structure, NAND strings NS11 to NS31 may be provided between a first bit line BL1 and a common source line CSL. The first bit line BL1 may correspond to the conductive material 5331, shown in FIGS. 5 and 6, extending in the third direction. NAND strings NS12 to NS32 may be arranged between a second bit line BL2 and the common source line CSL. The second bit line BL2 may correspond to the conductive material 5332, shown in FIGS. 5 and 6, extending in the third direction. NAND strings NS13 to NS33 may be located between a third bit line BL3 and the common source line CSL. The third bit line BL3 may correspond to the conductive material 5333, shown in FIGS. 5 and 6, extending in the third direction.

A source select transistor SST of each NAND string NS may be coupled electrically to a corresponding bit line BL. A ground select transistor GST of each NAND string NS may be coupled electrically to the common source line CSL. Memory cells MC may be arranged between the source select transistor SST and the ground select transistor GST of each NAND string NS.

In this example, NAND strings NS may be established by units of rows and columns and NAND strings NS which are coupled electrically to one-bit line may form one column. The NAND strings NS11 to NS31 which are coupled electrically to the first bit line BL1 may correspond to a first column. The NAND strings NS12 to NS32 which are coupled electrically to the second bit line BL2 may correspond to a second column. The NAND strings NS13 to NS33 which are coupled electrically to the third bit line BL3 may correspond to a third column. NAND strings NS which are coupled electrically to one source select line SSL may form one row. The NAND strings NS11 to NS13 which are coupled electrically to a first source select line SSL1 may constitute a first row. The NAND strings NS21 to NS23 which are coupled electrically to a second source select line SSL2 may make a second row. The NAND strings NS31 to NS33 which are coupled electrically to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each of the NAND strings NS, the height of memory cell MCN adjacent to the string select transistor SST may be 'N'.

The source select transistors SST of the NAND strings NS in the same row may share the source select line SSL. The source select transistors SST of the NAND strings NS in different rows may be respectively coupled electrically to the different source select lines SSL1, SSL2, and SSL3.

The memory cells at the same height in the NAND strings NS in the same row may share a word line WL. That is, at the same height, the word lines WL coupled electrically to the memory cells MC of the NAND strings NS in different rows may be coupled electrically. Dummy memory cells DMC at the same height in the NAND strings NS of the same row may share a dummy word line DWL. Namely, at the same height or level, the dummy word lines DWL coupled electrically to the dummy memory cells DMC of the NAND strings NS in different rows may be coupled electrically.

The word lines WL or the dummy word lines DWL located at the same level, at same height or in same layer may be coupled electrically with one another at layers where the conductive materials 5211 to 5291, 5212 to 5292, and 5213 to 5293 extending in the first direction may be provided. The conductive materials 5211 to 5291, 5212 to 5292, and 5213 to 5293 extending in the first direction may be coupled electrically, in common, to upper layers through contacts. At the upper layers, the conductive materials 5211 to 5291, 5212 to 5292, and 5213 to 5293 extending in the first direction may be coupled electrically. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23, and NS31 to NS33 may be coupled electrically to the ground select line GSL.

The common source line CSL may be coupled electrically to the NAND strings NS. Over the active regions and over the substrate 5111, the first to fourth doping regions 5311 to 5314 may be coupled electrically. The first to fourth doping regions 5311 to 5314 may be coupled electrically to an upper layer through contacts. Through the upper layer, the first to fourth doping regions 5311 to 5314 may be coupled electrically.

Namely, as shown in FIG. 8, the word lines WL of the same height or level may be coupled electrically. Accordingly, when a word line WL at a specific height is selected, all NAND strings NS which are coupled electrically to the word line WL may be selected. The NAND strings NS in different rows may be coupled electrically to different source select lines SSL. Accordingly, among the NAND strings NS coupled electrically to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. The invention is not limited to the illustration made and described in FIG. 8. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group. Memory cells, for example, MC4 to MCN, adjacent to the string select transistor SST may be referred to as an upper memory cell group.

Hereinbelow, detailed descriptions will be made with reference to FIGS. 9 to 11, which show the memory device in the memory system according to an embodiment implemented with a 3D nonvolatile memory device, the structure of which is different from the structure described with reference to FIGS. 5 to 8.

Figure 9:
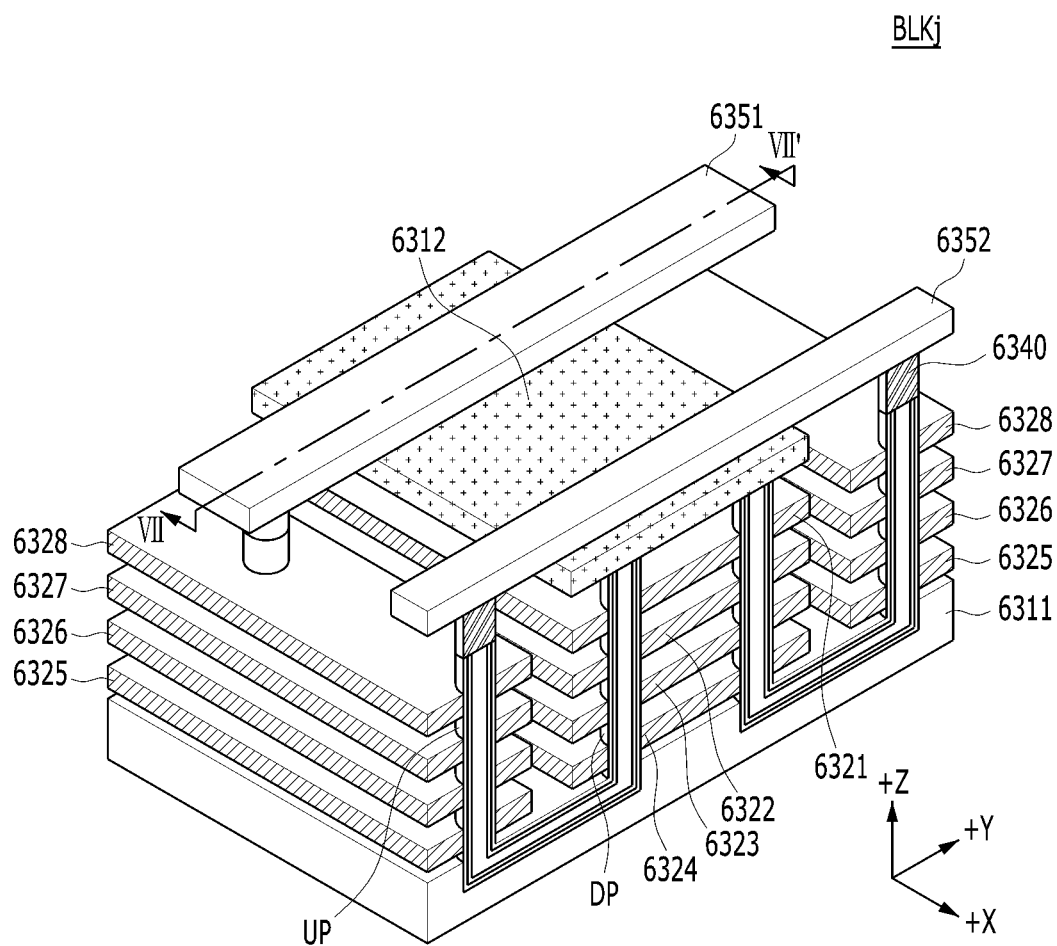

FIG. 9 is a perspective view schematically illustrating the 3D nonvolatile memory device. Specifically, FIG. 9 shows a memory block BLKj, which may correspond to any one memory block among the plurality of memory blocks BLK1 to BLKN-1 of FIG. 4. FIG. 10 is a cross-sectional view of the memory block BLKj taken along the line VII-VII' of FIG. 9.

Figure 10:
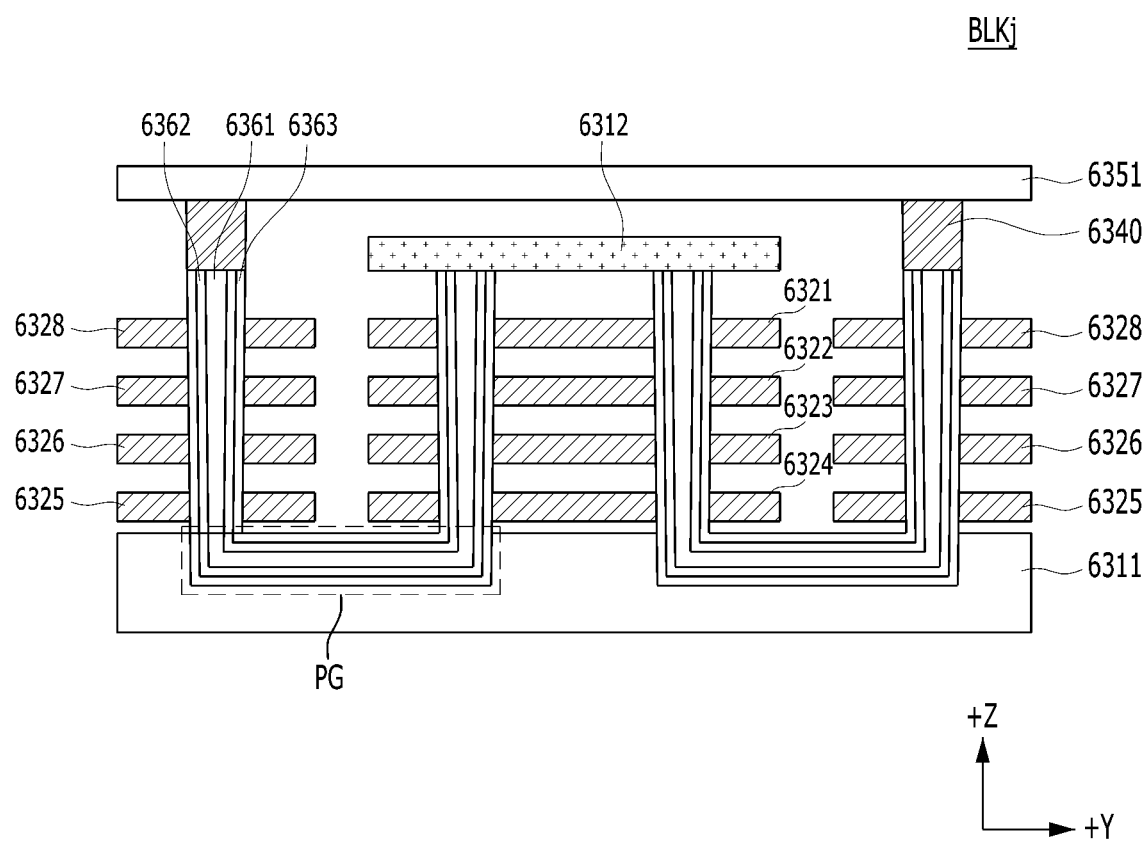

Referring to FIGS. 9 and 10, the memory block BLKj may include structures extending in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the described embodiment for ease of description that the substrate 6311 is p-type silicon, it is to be noted that the substrate 6311 is not limited to p-type silicon.

First to fourth conductive materials 6321 to 6324 extending in the x-axis direction and the y-axis direction may be provided over the substrate 6311. The first to fourth conductive materials 6321 to 6324 may be separated by a predetermined distance in the z-axis direction.

Fifth to eighth conductive materials 6325 to 6328 extending in the x-axis direction and the y-axis direction may be provided over the substrate 6311. The fifth to eighth conductive materials 6325 to 6328 may be separated by a predetermined distance in the z-axis direction. The fifth to eighth conductive materials 6325 to 6328 may be separated from the first to fourth conductive materials 6321 to 6324 in the y-axis direction.

A plurality of lower pillars DP may pass through the first to fourth conductive materials 6321 to 6324. Each lower pillar DP may extend in the z-axis direction. Also, a plurality of upper pillars UP may pass through the fifth to eighth conductive materials 6325 to 6328. Each upper pillar UP may extend in the z-axis direction.

Each of the lower and the upper pillars DP and UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower and the upper pillars DP and UP may be coupled electrically through a pipe gate PG. The pipe gate PG may be disposed in the substrate 6311. For instance, the pipe gate PG may include the same material as the material employed for the lower and upper pillars DP and UP.

A doping material 6312 of a second type extending in the x-axis and the y-axis directions may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 extending in the y-axis direction may be provided over the drains 6340.

The first and second upper conductive materials 6351 and 6352 may be separated in the x-axis direction. The first and second upper conductive materials 635 and 6352 may include a metal. The first and second upper conductive materials 6351 and 6352 and the drains 6340 may be coupled electrically through contact plugs. The first and second upper conductive materials 6351 and 6352 may serve as first and second bit lines BL1 and BL2, respectively.

The first conductive material 6321 may serve as a source select line SSL. The second conductive material 6322 may work as a first dummy word line DWL1. The third and fourth conductive materials 6323 and 6324 may serve as first and second main word lines MWL1 and MWL2(not shown), respectively. The fifth and sixth conductive materials 6325 and 6326 may serve as third and fourth main word lines MWL3 and MWL4, respectively. The seventh conductive material 6327 may function as a second dummy word line DWL2. The eighth conductive material 6328 may work as a drain select line DSL.

The lower pillar DP and the first to fourth conductive materials 6321 to 6324 adjacent to the lower pillar DP may form a lower string. The upper pillar UP and the fifth to eighth conductive materials 6325 to 6328 adjacent to the upper pillar UP may form an upper string. The lower string and the upper string may be coupled electrically through the pipe gate PG. One end of the lower string may be coupled electrically to the doping material 6312 of the second type which serves as the common source line CSL. One end of the upper string may be coupled electrically to a corresponding bit line through the drain 6340. One lower string and one upper string may constitute one cell string coupled electrically between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1 and the first and second main memory cells MMC1 and MMC2. The upper string may include the third and fourth main memory cells MMC3 and MMC4, the second dummy memory cell DMC2 and a drain select transistor DST.

In FIGS. 9 and 10, the upper string and the lower string may make a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
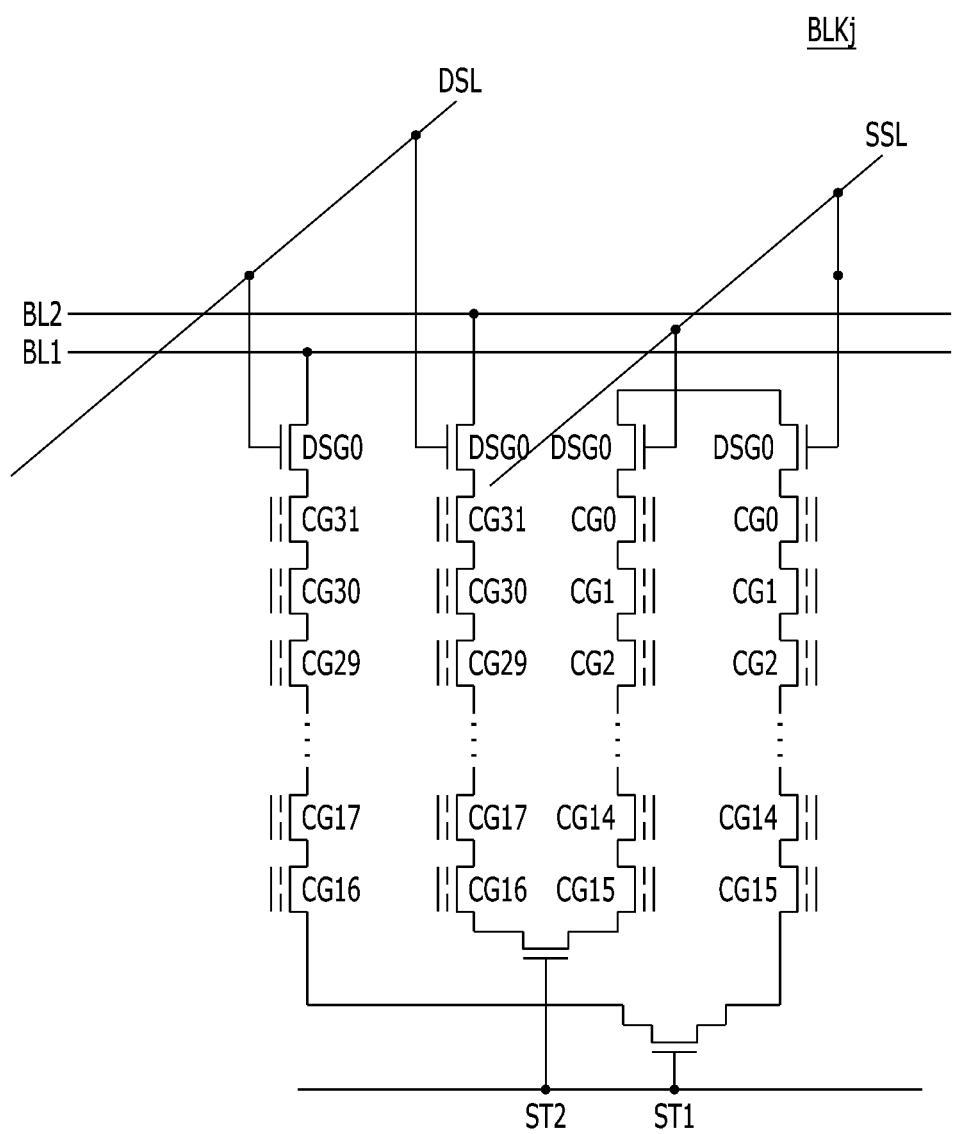

FIG. 11 is a circuit diagram illustrating the memory block BLKj of FIGS. 9 and 10, according to an embodiment. For ease of description and illustration, only a first and a second string ST1 and ST2 of the memory block BLKj are shown.

Referring to FIG. 11, in the memory block BLKj among the plurality of blocks BLK1 to BLKN-1 of FIG. 4, cell strings, each of which is implemented with one upper string and one lower string coupled electrically through the pipe gate PG as described above with reference to FIGS. 9 and 10, may be provided in such a way as to constitute a plurality of pairs.

Namely, in the certain memory block BLKj, memory cells CG0 to CG31 stacked along a first channel CH1 (not shown), for example, at least one source select gate and at least one drain select gate may form a first string ST1. Memory cells CG0 to CG31 stacked along a second channel CH2 (not shown), for example, at least one source select gate and at least one drain select gate may form a second string ST2.

The first and the second strings ST1 and ST2 may be coupled electrically to the same drain select line DSL and the same source select line SSL. The first string ST1 may be coupled electrically to a first bit line BL1, while the second string ST2 may be coupled electrically to a second bit line BL2.

While it is described in FIG. 11 for ease of description and illustration that the first and second strings ST1 and ST2 may be coupled electrically to the same drain select line DSL and the same source select line SSL, different layouts may be applied in various embodiments. For example, in an embodiment, the first and second strings ST1 and ST2 may be coupled electrically to the same source select line SSL and the same bit line BL. The first string ST1 may be coupled electrically to a first drain select line, while the second string ST2 may be coupled electrically to a second drain select line. Further it may be envisaged that the first and second strings ST1, ST2 may be coupled electrically to the same drain select line DSL and the same bit line BL. The first string ST1 may be coupled electrically to a first source select line, while the second string ST2 may be coupled electrically a second source select line.

Hereinafter, an operation of programming program data and dummy data into memory cells MC coupled to component word lines included in a group word line in the memory system will be described in detail with reference to FIGS. 12 to 14 in accordance with an embodiment of the invention.

Figure 12:
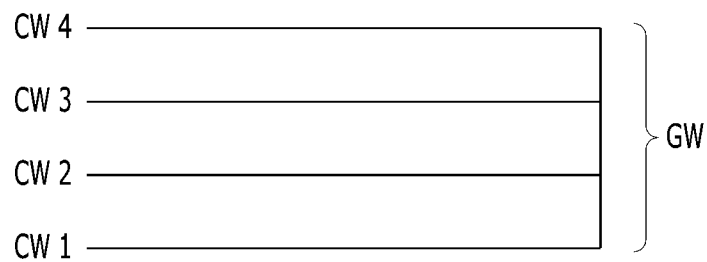
FIG. 12 is a cross-sectional diagram illustrating a memory block.

FIG. 12 is a cross-sectional diagram illustrating the memory block BLKi of FIGS. 5 to 8, according to a line III-III'. Although FIGS. 12 to 13 shows a single bit line BL coupled to four (4) NAND strings NS, an embodiment of the invention will not be limited to a single bit line BL coupled to four (4) NAND strings NS, and the number of NAND strings NS may vary depending on design.

As described with reference to FIG. 8, memory cells MC of the same height of the NAND strings NS of the same row may share a word line WL. Referring to FIG. 12, a component word line CW may correspond to the word line WL coupled to the memory cells MC of the same height of the NAND strings NS of the same row. For example, a first component word line CW1 may correspond to the word line WL coupled to the memory cells MC of the same height of the NAND strings NS11 to NS13 coupled to a first string select line SSL1 as a first row (shown in FIG. 8). For example, a second component word line CW2 may correspond to the word line WL coupled to the memory cells MC of the same height of the NAND strings NS21 to NS23 coupled to a second string select line SSL2 as a second row (shown in FIG. 8). For example, a third component word line CW3 may correspond to the word line WL coupled to the memory cells MC of the same height of the NAND strings NS31 to NS33 coupled to a third string select line SSL3 as a third row (shown in FIG. 8). Although not illustrated in FIG. 8, a fourth component word line CW4 may correspond to the word line WL coupled to the memory cells MC of the same height of the NAND strings NS41 to NS43 coupled to a fourth string select line SSL4 as a fourth row.

As described with reference to FIG. 8, word lines WL coupled to memory cells MC of the same height of the NAND strings NS of the different rows may be commonly coupled to one another. Referring to FIG. 12, a group word line GW may correspond to a group of commonly coupled component word lines CWL coupled to memory cells MC of the same height of the NAND strings NS of the different rows. For example, the first to fourth component word lines CW1 to CW4 may be commonly coupled to one another to form a single group word line GW.

When a program operation fails to memory cells MC coupled to one among first to fourth component word lines CW1 to CW4 included in the group word line GW, data already normally programmed into the memory cells MC coupled to the remaining ones among the first to fourth component word lines CW1 to CW4 may be processed as failure due to a structural characteristic of a memory block BLKi having the group word line GW formed through a physical coupling of the first to fourth component word lines CW1 to CW4.

In a conventional memory system, the controller 130 may control the memory device 150 to program first to fourth pieces of program data included in program data group into all of memory cells MC coupled to the first to fourth component word lines CW1 to CW4 included in a single group word line GW. In response to a program request for the program data group, the controller 130 may control the memory device 150 to sequentially program first to fourth pieces of program data included in program data group into memory cells MC coupled to the first to fourth component word lines CW1 to CW4 included in a single group word line GW, respectively.

Accordingly, as described above, when a program operation fails to memory cells MC coupled to one among the first to fourth component word lines CW1 to CW4 included in the group word line GW, data already normally programmed into the memory cells MC coupled to the remaining ones among the first to fourth component word lines CW1 to CW4 may be processed as having failed, which is referred to as "concurrent failure", due to a structural characteristic of a memory block BLKi having the group word line GW formed through a physical coupling of the first to fourth component word lines CW1 to CW4. For example, it is assumed that a first piece of program data is normally programmed into memory cells MC coupled to the first component word line CW1 and a second piece of program data is normally programmed into memory cells MC coupled to the second component word line CW2. In this case, when a third piece of program data fails to be programmed into memory cells MC coupled to the third component word line CW3, the first and second pieces of program data already normally programmed into the memory cells MC coupled to the first and second component word lines CW1 and CW2 may be processed as failure as well as the failed third piece of program data. Therefore, it is a problem that the controller 130 should control the memory device 150 to perform again program operations of programming the first and second pieces of program data, which are normally programmed through previous successful program operations, as well as the failed third piece of program data.

In accordance with an embodiment of the invention, the controller 130 may control the memory device 150 to perform program operations of programming program data and dummy data into memory cells MC coupled to the first to fourth component word lines CW1 to CW4 included in the group word line GW thereby avoiding or preventing the concurrent failure.

Figure 13:
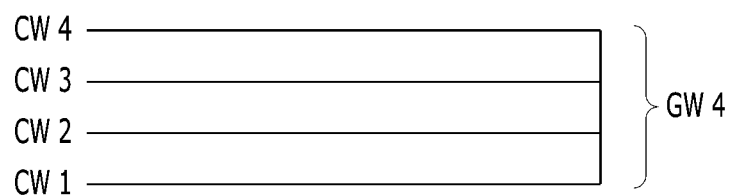
FIG. 13 is a diagram illustrating a plurality of group word lines.
Figure 13:
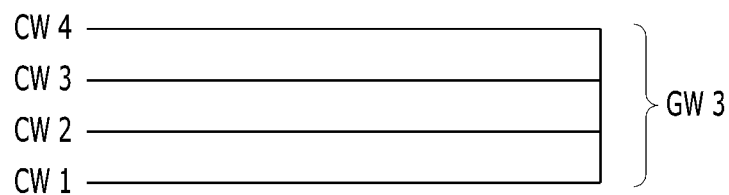
Figure 13:
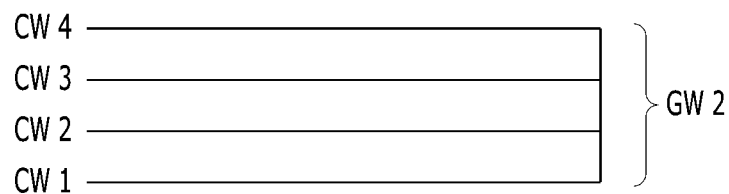
Figure 13:
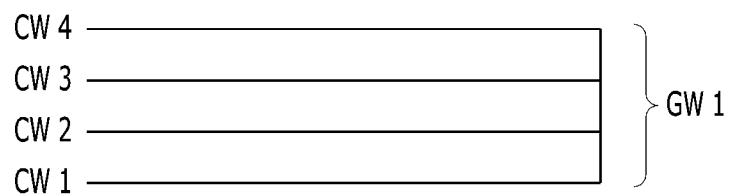

FIG. 13 is a diagram illustrating a plurality of group word lines GW1 to GW4.

Referring back to FIG. 1, the processor 134 of the controller 130 may control overall operations of the memory system 110. Particularly, the processor 134 may control the memory device 150 to perform a program operation in response to a program request provided from the host 102. The controller 130 may control the memory device 150 to perform program operations of programming program data and dummy data into memory cells MC coupled to the first to fourth component word lines CW1 to CW4 included in the group word line GW.

In response to the program request entered with program data, the controller 130 may control the memory device 150 to generate dummy data corresponding to the program data. In accordance with an embodiment of the invention, the controller 130 may control the memory device 150 to generate the program data as the dummy data corresponding to the program data. In accordance with an embodiment of the invention, the controller 130 may control the memory device 150 to generate log information data of the program data as the dummy data corresponding to the program data.

The controller 130 may control the memory device 150 to select a group word line GW to perform program operations with the program data and the dummy data into memory cells MC coupled to the first to fourth component word lines CW1 to CW4 included in the group word line GW.

As described above with reference to FIG. 8, heights of memory cells MC in the respective NAND strings NS may be determined. Memory cells MC of the same height may be coupled to the first to fourth component word lines CW1 to CW4 included in the same group word line GW. Referring to FIG. 13, the first to fourth group word lines GW1 to GW4 may be coupled to memory cells MC of different heights (hereinafter, referred to as the first to fourth group word lines GW1 to GW4 of different heights). The controller 130 may control the memory device 150 to select one among the first to fourth group word lines GW1 to GW4 of different heights.

The controller 130 may control the memory device 150 to sequentially select one among the first to fourth component word lines CW1 to CW4 to perform program operation with the program data and dummy data into memory cells MC coupled to the first to fourth component word lines CW1 to CW4 included in the selected group word line GW.

As described with reference to FIG. 8, when a specific word line WL is selected, all of NAND strings NS coupled to the selected word line WL may be selected. Therefore, rows of NAND strings NS may be selected through the selection of the first to fourth string select lines SSL1 to SSL4. The controller 130 may control the memory device 150 to sequentially select the first to fourth string select lines SSL1 to SSL4 to sequentially select the first to fourth component word lines CW1 to CW4 included in the group word line GW and respectively corresponding to the first to fourth string select lines SSL1 to SSL4.

In accordance with an embodiment of the invention, the controller 130 may control the memory device 150 to select the first component word line CW1 included in the group word line GW as a target word line WL coupled to target memory cells MC, to which a program operation is performed to store the program data. The controller 130 may control the memory device 150 to select the first string select line SSL1 to select the first component word line CW1 included in the group word line GW.

In accordance with an embodiment of the invention, the controller 130 may control the memory device 150 to select the second to fourth component word lines CW2 to CW4 included in the group word line GW as target word lines WL coupled to target memory cells MC, to which a program operation is performed to store the dummy data corresponding to the program data stored in the memory cells MC coupled to the first component word line CW1. The controller 130 may control the memory device 150 to select the second to fourth string select lines SSL2 to SSL4 so as to select the second to fourth component word lines CW2 to CW4 included in the group word line GW.

The controller 130 may control the memory device 150 to perform program operations with the program data and dummy data corresponding to the program data into memory cells MC coupled to the first to fourth component word lines CW1 to CW4 included in the selected group word line GW. The controller 130 may control the memory device 150 to perform program operations of programming the program data into memory cells MC coupled to the first component word line CW1 included in the selected group word line GW. The controller 130 may enable the memory device 150 to perform program operations with the dummy data corresponding to the program data into memory cells MC coupled to the second to fourth component word lines CW2 to CW4 included in the selected group word line GW.

As described above with reference to FIG. 8, different group word lines GW may be located at different heights in the 3D cell array of the memory block BLKi. In accordance with an embodiment of the invention, the controller 130 may control the memory device 150 to perform program operations with the program data and dummy data corresponding to the program data into memory cells MC coupled by sequentially selecting the group word lines GW in ascending order from the group word line GW located lowermost (i.e., the group word line GW of the lowest height) in the 3D cell array.

In each of the second to fourth group word lines GW2 to GW4 selected for subsequent program data, controller 130 may control the memory device 150 to perform program operations with the subsequent program data onto memory cells MC, coupled to the first component word line CW1 included in the selected group word line GW, and perform program operations with subsequent dummy data corresponding to the subsequent program data onto memory cells MC coupled to the second to fourth component word lines CW2 to CW4 included in the selected group word line GW. The subsequent program data may be provided along with a subsequent program request received from the host 102 after the program request for the program data is delivered. The subsequent dummy data may be generated, corresponding to the subsequent program data.

In accordance with an embodiment of the invention, the controller 130 may control the memory device 150 to perform program operations with plural pieces of program data into memory cells MC coupled to the first component word lines CW1 included in different group word lines GW of different heights, thereby avoiding or preventing the concurrent failure. Data group is determined to include program data and dummy data for the convenience of description. For example, it is assumed that a first data group is normally programmed into memory cells MC coupled to the first to fourth component word lines CW1 to CW4 included in the first group word line GW1 while a second data group is normally programmed into memory cells MC coupled to the first to fourth component word lines CW1 to CW4 included in the second group word line GW2. In this example, when a third piece of program data fails to be programmed into memory cells MC coupled to the first component word line CW1 included in the third group word line GW3, the controller 130 may allow the memory device 150 to perform again a program operation with the third piece of program data without performing again program operations with the first and second pieces of program data.

In accordance with an embodiment of the invention, when a program interrupt (e.g., the sudden power off (SPO)) occurs while programming the dummy data, the controller 130 may control the memory device 150 to perform an operation of programming data into memory cells MC coupled to the first component word line CW1 included in a subsequent group word line GW after a recovery operation for the program interrupt ends.

In accordance with an embodiment of the invention, the controller 130 may control the memory device 150 to perform a program operation with subsequent program data into memory cells MC coupled to the first component word line CW1 included in the subsequent group word line GW. In accordance with an embodiment of the invention, the controller 130 may control the memory device 150 to perform again a program operation with the program data into memory cells MC coupled to the first component word line CW1 included in the subsequent group word line GW.

Figure 14:
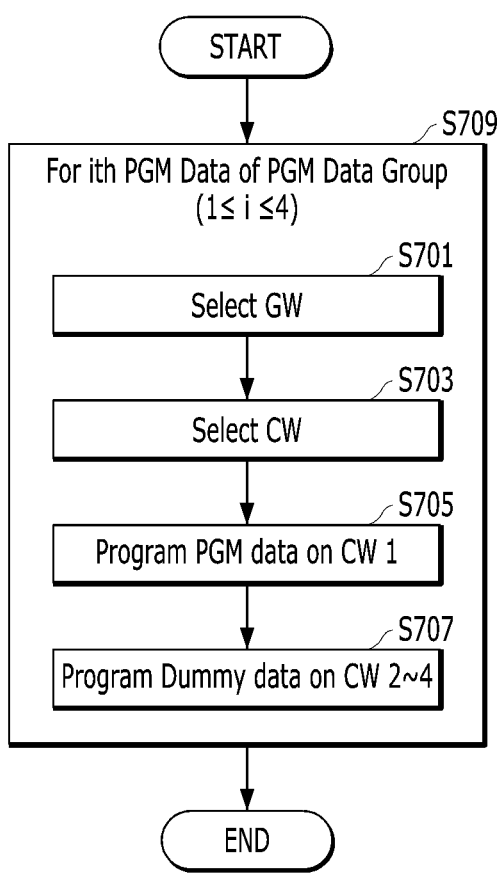
FIG. 14 is a flowchart describing a program operation, according to an embodiment of the invention.

FIG. 14 is a flowchart describing a program operation in accordance with an embodiment of the invention.

In accordance with an embodiment of the invention, the program operation may include a step S701 of selecting a group word line GW; a step S703 of selecting a component word line CW; a step S705 of programming program data (denoted as "PGM" in FIG. 14); and a step S707 of programming dummy data.

At step S701, the controller 130 may control the memory device 150 to select a group word line GW to perform program operations with the program data and dummy data into memory cells MC coupled to the first to fourth component word lines CW1 to CW4 included in the selected group word line GW. The dummy data may be the program data or log information of the program data. The controller 130 may control the memory device 150 to select one among the first to fourth group word lines GW1 to GW4, each having different heights, in the memory block BLKi.

At step S703, the controller 130 may control the memory device 150 to select one among the first to fourth component word lines CW1 to CW4 included in the group word line GW selected at step S701 to perform program operations of programming the program data and dummy data into memory cells MC coupled to the first to fourth component word lines CW1 to CW4 included in the selected group word line GW. The controller 130 may control the memory device 150 to sequentially select the first to fourth component word lines CW1 to CW4 included in the group word line GW by sequentially selecting the first to fourth string select lines SSL1 to SSL4, respectively, corresponding to the first to fourth component word lines CW1 to CW4.

At step S705, the controller 130 may control the memory device 150 to perform program operations with the program data into memory cells MC coupled to the first to fourth component word lines CW1 to CW4 included in the group word line GW, which are selected at steps S701 and 703. The controller 130 may control the memory device 150 to perform a program operation of programming the program data into memory cells MC coupled to the first component word line CW1 included in the selected group word line GW.

At step S707, the controller 130 may control the memory device 150 to perform program operations of programming the generated dummy data and program data into memory cells MC coupled to the first to fourth component word lines CW1 to CW4 included in the group word line GW, which are selected at steps S701 and 703. The controller 130 may control the memory device 150 to perform program operations with the program data into memory cells MC coupled to the first component word line CW1 included in the selected group word line GW. The controller 130 may control the memory device 150 to perform program operations with the dummy data corresponding to the program data into memory cells MC coupled to the second to fourth component word lines CW2 to CW4 included in the selected group word line GW.

At step S709, the controller 130 may control the memory device 150 to repeat steps S701 to S707 for second to fourth program data, thereby programming first to fourth program data included in program data group into memory cells MC coupled to different group word lines GW1 to GW4.

In accordance with an embodiment of the invention, when a program interrupt (e.g., the sudden power off (SPO)) occurs while programming the dummy data into memory cells MC coupled to the second to fourth component word lines CW2 to CW4 included in the group word line GW, the controller 130 may control the memory device 150 to continue performing a program operation by selecting another group word line GW without performing again an operation of programming data, which is normally programmed into memory cells MC coupled to the first component word line CW1 included in the group word line GW. For example, when the program interrupt occurs while programming a first piece of dummy data into memory cells MC coupled to the third component word line CW3 included in the first group word line GW1, the controller 130 may control the memory device 150 to continue performing a program operation with a second piece of program data into memory cells MC coupled to the first component word line CW1 included in the second group word line GW2 without performing again another operation of programming the first piece of program data, which is normally programmed into memory cells MC coupled to the first component word line CW1 included in the first group word line GW1.

In accordance with an embodiment of the invention, when the program interrupt occurs while programming the dummy data into memory cells MC coupled to the second to fourth component word lines CW2 to CW4 included in the group word line GW, the controller 130 may control the memory device 150 to perform an operation of programming data, which is normally programmed into memory cells MC coupled to the first component word line CW1 included in the group word line GW, into memory cells MC coupled to another group word line GW, and to continue performing a program operation. For example, when the program interrupt occurs while programming a first piece of dummy data into memory cells MC coupled to the third component word line CW3 included in the first group word line GW1, the controller 130 may control the memory device 150 to perform a program operation with the first piece of program data, which is normally programmed into memory cells MC coupled to the first component word line CW1 included in the first group word line GW1, into memory cells MC coupled to the first component word line CW1 included in the second group word line GW2, and to perform again another program operation with the first piece of dummy data into memory cells MC coupled to the second to fourth component word lines CW2 to CW4 included in the second group word line GW2.

In accordance with an embodiment of the invention, the controller 130 may allow the memory device 150 to perform program operations with plural pieces of program data included in a single program data group into memory cells MC coupled to the component word lines CW included in separate group word lines GW, respectively, thereby avoiding or preventing the concurrent failure in which data already normally programmed into the memory cells MC coupled to the remaining ones among the first to fourth component word lines CW1 to CW4 is processed as failure when a program operation fails to memory cells MC coupled to one among the first to fourth component word lines CW1 to CW4 included in the group word line GW.

For example, it is assumed that a first data group is normally programmed into memory cells MC coupled to the first to fourth component word lines CW1 to CW4 included in the first group word line GW1 and a second data group is normally programmed into memory cells MC coupled to the first to fourth component word lines CW1 to CW4 included in the second group word line GW2. In this case, even when a third piece of program data fails to be programmed into memory cells MC coupled to the first component word line CW1 included in the third group word line GW3, the first and second pieces of program data already normally programmed into memory cells MC coupled to the group word line GW other than the third group word line GW3 may not be treated as failure.

In accordance with an embodiment of the invention, the controller 130 may control the memory device 150 to generate dummy data, which is the same as the program data, and to perform a program operation with the dummy data into memory cells MC, thereby improving or enhancing the reliability of the program data. In accordance with an embodiment of the invention, the controller 130 may control the memory device 150 to generate dummy data, which is the log information data of the program data, and to perform a program operation of programing the dummy data into memory cells MC, thereby utilizing the dummy data for later defect analysis.

What is claimed is:

1. A memory system comprising:
a memory device including a three dimensional (3D) cell array, in which some of plural memory cells having a same height over a substrate are connected to a single component word line among plural component word lines, and the plural component word lines having the same height over the substrate are connected to a single group word line; and
a controller configured to controlling the memory device to perform a program operation with program data and dummy data, the program data being input from an external device,
wherein the program data is programmed in memory cells connected to a first component word line among the plural component word lines connected to the single group word line, and the dummy data is programmed in memory cells connected to a second component word line among the plural component word lines connected to the single group word line.

2. The memory system of claim 1, wherein the dummy data is not input from the external device after the program data is inputted from the external device.

3. The memory system of claim 2, wherein the dummy data includes a duplication of the program data.

4. The memory system of claim 2, wherein the dummy data is generated internally.

5. The memory system of claim 4, wherein the dummy data is generated internally with respected to the program data.

6. The memory system of claim 2, wherein the program data is programmed prior to the dummy data.

7. The memory system of claim 6, wherein the dummy data is programmed in memory cells connected to all of the plural component word lines connected to the single group word line except for the first word line.

8. A method for operating a memory device including a three dimensional (3D) cell array, in which some of plural memory cells having a same height over a substrate are connected to a single component word line among plural component word lines, and the plural component word lines having the same height over the substrate are connected to a single group word line, comprising:
receiving program data input from an external device;
programming the program data in memory cells connected to a first component word line among the plural component word lines connected to the single group word line; and
programming dummy data in other memory cells connected to a second component word line among the plural component word lines connected to the single group word line.

9. The method of claim 8, wherein the dummy data is not input from the external device after the program data is input from the external device.

10. The method of claim 9, wherein the dummy data includes a duplication of the program data.

11. The method of claim 9, wherein the dummy data is generated internally.

12. The method of claim 11, wherein the dummy data is generated internally with respected to the program data.

13. The method of claim 9, wherein the program data is programmed prior to the dummy data.

14. The method of claim 13, wherein the dummy data is programmed in memory cells connected to all of the plural component word lines connected to the single group word line except for the first word line.

15. A controller for operating a memory device including a memory device including a group word line coupled to plural component word lines, each component word lines coupled to plural non-volatile memory cells, wherein the controller is configured to perform a program operation with program data which is input from an external device, and the program operation including programming the program data in memory cells coupled to at least one component word line among the plural component word lines coupled to the group word line and programming dummy data in other memory cells coupled to at least one remaining component word line among the plural component word lines coupled to the group word line.

16. The controller of claim 15, wherein the controller is configured to generate the dummy data based on the program data.

17. The controller of claim 16, wherein the dummy data includes at least one of a duplication of the program data or a log of the program data.

18. The controller of claim 15, wherein the controller is configured to program the dummy data in memory cells coupled to all remaining component word lines of the plural component word lines connected to the single group word line except for the first word line.

19. The controller of claim 15, wherein the controller is configured to program the program data earlier than the dummy data in the memory device.

20. The controller of claim 19, wherein, when the programming of the dummy data is interrupted by a sudden power off (SPO), the controller is configured to skip the programming of the dummy data after power is retrieved.

* * * * *